US012798958B2

(12) United States Patent
Kilpinen et al.

(10) Patent No.: US 12,798,958 B2
(45) Date of Patent: Nov. 17, 2026

(54) DOUBLE LAYER MEMS DEVICES AND METHOD OF MANUFACTURE

(71) Applicant: Murata Manufacturing Co., Ltd., Nagaokakyo (JP)

(72) Inventors: Petteri Kilpinen, Espoo (FI); Marko Peussa, Espoo (FI); Antti Iihola, Helsinki (FI); Altti Torkkeli, Tuusula (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 363 days.

(21) Appl. No.: 18/632,684

(22) Filed: Apr. 11, 2024

(65) Prior Publication Data

US 2024/0343558 A1 Oct. 17, 2024

(30) Foreign Application Priority Data

Apr. 14, 2023 (EP) .................................... 23167967

(51) Int. Cl.
*B81B 3/00* (2006.01)
*B81C 1/00* (2006.01)

(52) U.S. Cl.
CPC ............ *B81B 3/0072* (2013.01); *B81B 3/001* (2013.01); *B81C 1/00666* (2013.01); *B81C 1/00968* (2013.01); *B81B 2201/0235* (2013.01); *B81B 2201/0242* (2013.01); *B81B 2201/0264* (2013.01); *B81B 2203/0307* (2013.01); *B81B 2203/04* (2013.01); *B81B 2207/096* (2013.01); *B81C 2201/0109* (2013.01); *B81C 2201/0132* (2013.01); *B81C 2201/0133* (2013.01); *B81C 2203/0109* (2013.01); *B81C 2203/036* (2013.01)

(58) Field of Classification Search
None
See application file for complete search history.

(56) References Cited

U.S. PATENT DOCUMENTS

| | | | | |
|---|---|---|---|---|
| 7,317,233 | B2 | 1/2008 | Lutz et al. | |
| 9,463,976 | B2 | 10/2016 | Steimle et al. | |
| 10,830,590 | B2 | 11/2020 | Schelling et al. | |
| 2012/0126349 | A1 * | 5/2012 | Horning ................ | B81B 7/0032 257/E21.599 |

(Continued)

FOREIGN PATENT DOCUMENTS

| | | | |
|---|---|---|---|
| WO | 2017/056697 | A1 | 4/2017 |
| WO | 2023/032304 | A1 | 3/2023 |

*Primary Examiner* — Bilkis Jahan
(74) *Attorney, Agent, or Firm* — ArentFox Schiff LLP

(57) ABSTRACT

A device is provided that includes a handle layer with at least one cavity and suspension structure, a patterned polycrystalline silicon (poly-Si) first device layer, where at least one structural element is suspended by the structure, and may include a seismic element. A second electrically insulating layer is present, followed by a second device layer of patterned single-crystal silicon (mono-Si) with at least one moveably suspended seismic element above the first layer. A cap layer finalizes the structure, with the handle layer, device layers, and the cap layer forming an enclosure's walls. The first and second insulating layers bond the handle and device layers. The enclosure includes at least one seismic element from the second device layer, and at least one static and moveable electrode for motion detection or causation, with the static electrode in the first device layer.

20 Claims, 6 Drawing Sheets

(56) References Cited

U.S. PATENT DOCUMENTS

| | | | | |
|---|---|---|---|---|
| 2015/0008540 | A1* | 1/2015 | Chu | B81C 1/00222 257/415 |
| 2015/0232327 | A1* | 8/2015 | Reinmuth | B81C 1/0019 257/417 |
| 2016/0039668 | A1* | 2/2016 | Zhang | B81C 1/0023 257/417 |
| 2016/0362296 | A1* | 12/2016 | Lee | B81C 1/00301 |
| 2018/0029881 | A1* | 2/2018 | Cheng | B81B 7/007 |
| 2018/0162723 | A1 | 6/2018 | Degawa et al. | |
| 2020/0156930 | A1 | 5/2020 | Classen et al. | |
| 2024/0174511 | A1 | 5/2024 | Fukumitsu et al. | |

* cited by examiner

DOUBLE LAYER MEMS DEVICES AND METHOD OF MANUFACTURE

CROSS REFERENCED TO RELATED APPLICATIONS

This application claims priority to European Patent Application No. 23167967.1, filed Apr. 14, 2023, the entire contents of which is hereby incorporated in the entirety.

TECHNICAL FIELD

The present disclosure relates to MEMS devices and a method of producing MEMS devices. More particularly, the present disclosure relates to MEMS devices comprising two device layers and to method for manufacturing double layer MEMS devices.

BACKGROUND

Microelectromechanical systems (MEMS) devices manufactured using silicon-based technology are widespread. Typical application of MEMS device is an inertial sensor that detects at least one of acceleration and angular velocity. MEMS devices of this type are widely used in consumer, automotive and industrial applications.

Capacitive sensing in MEMS devices is implemented by detecting change of capacitance caused by change in distance between two electrodes. Typically, capacitance is sensed between a moveable electrode and one or more static electrodes.

In typical capacitive MEMS devices for inertial sensing, static electrodes are provided on a substrate, such as a handle or a cap wafer. For example, a metal electrode may be provided on a surface of the substrate wafer. The MEMS device is subject to various sources of stress. During packaging of components, some steps of the manufacturing method such as molding applies pressure on the substrate. Different materials have different thermal characteristics and therefore the substrate may also be subject to pressure due to differences in thermal expansion of materials within the MEMS device package. The MEMS device may also be subject to various external forces causing changes in the shape of the substrate. Environment in which the MEMS device is used may be subject to great temperature changes, vibration, impacts and so on, all causing stress on the MEMS device. When static electrodes are attached to the substrate, any change in form of the substrate caused by stress may also affect distance between the static electrodes and respective moveable electrodes. This causes risk of deterioration of accuracy of capacitive sensing.

In the following description, reference will be made to an inertial MEMS sensor and to the problems for the manufacturing thereof. However, the present disclosure generally applies to other types of MEMS devices. For example, the MEMS device may comprise one or more of the following structures, single or combined with each other: accelerometer, gyroscope, geophone, inclinometer and resonator. Furthermore, the MEMS device may be a MEMS actuator.

For example, U.S. Pat. No. 10,830,590 discloses a micromechanical sensor with a substrate including a mechanical functional layer made of monocrystalline silicon and an electrode device. An electrically conductive wiring layer with aluminium or tungsten wiring.

In another example, U.S. Patent Publication 2020/0156930 discloses a double side capacitive sensing MEMS device having a hollow body. This device is manufactured by epitaxial growing of a polysilicon (poly-Si) structure.

In another example, U.S. Pat. No. 9,463,976 discloses a vertically stacked MEMS device wafer assembly to generate an integrated MEMS device having vertically stacked inertial transducer elements each in different layer of the multilayer semiconductor structure. Different MEMS transducer structures are hermetically barred from ambient environment and from each other.

SUMMARY

An object of the present disclosure is to provide a method and apparatus for solving the problem of decreasing material costs of the MEMS device while improving robustness of the MEMS device with wider gap and smaller signal paths between device layers.

In some aspects, the techniques described herein relate to a microelectromechanical system (MEMS) device including, in order from bottom to top: a handle layer including at least one cavity and at least one suspension structure, a first electrically insulating layer, a first device layer formed by patterning a layer of deposited polycrystalline silicon (poly-Si), wherein at least one structural element in the first device layer is suspended by the at least one suspension structure, and the at least one structural element optionally includes at least one seismic element, a second electrically insulating layer, a second device layer including at least one seismic element moveably suspended above the first device layer, wherein the second device layer is formed by patterning a layer of single-crystal silicon (mono-Si), and a cap layer, wherein the handle layer, the first device layer, the second device layer and the cap layer, the first electrically insulating layer bonding the handle layer and the first device layer and the second electrically insulating layer bonding the first device layer and the second device layer are configured to form walls of an enclosure including the at least one seismic element in the second device layer, and at least one static electrode and at least one moveable electrode for detecting and/or causing motion of the at least one seismic element, wherein the at least one static electrode is in the first device layer.

In some aspects, the techniques described herein relate to a MEMS device, wherein the first electrically insulating layer includes at least one polycrystalline silicon (poly-Si) feedthrough extending from the first device layer to the second device layer for electrically coupling a structural element of the first device layer to a structural element of the second device layer and/or to an electrical connection provided in the cap layer.

In some aspects, the techniques described herein relate to a MEMS device, wherein electrically insulating material in the second electrically insulating layer has been removed about the at least one poly-Si feedthrough such that the at least one poly-Si feedthrough is an only mechanical contact between the respective structural elements of the first device layer and the second device layer.

In some aspects, the techniques described herein relate to a MEMS device, wherein the first device layer includes at least one stopper structure extending towards the second device layer over a distance that is less than thickness of the second electrically insulating layer.

In some aspects, the techniques described herein relate to a MEMS device, wherein the first device layer includes at least one stopper structure extending towards the second device layer over a distance that is less than thickness of the second electrically insulating layer.

In some aspects, the techniques described herein relate to a MEMS device, wherein the first device layer includes at least one stopper structure extending towards the second device layer over a distance that is less than thickness of the second electrically insulating layer.

In some aspects, the techniques described herein relate to a MEMS device, further including a metallic bonding layer between the second device layer and the cap layer, and the metallic bonding layer is further configured to form part of said walls of the enclosure.

In some aspects, the techniques described herein relate to a MEMS device, further including a metallic bonding layer between the second device layer and the cap layer, and the metallic bonding layer is further configured to form part of said walls of the enclosure.

In some aspects, the techniques described herein relate to a MEMS device, further including a metallic bonding layer between the second device layer and the cap layer, and the metallic bonding layer is further configured to form part of said walls of the enclosure. Moreover, a metallic bonding layer may be included between the second device layer and the cap layer, the metallic bonding layer being further configured to form part of said walls of the enclosure.

In some aspects, the techniques described herein relate to a method for manufacturing a microelectromechanical (MEMS) device including, in order from bottom to top: a handle layer including at least one cavity and at least one suspension structure, a first electrically insulating layer, a first device layer formed by patterning a layer of deposited polycrystalline silicon (poly-Si), wherein at least one structural element in the first device layer is suspended by the at least one suspension structure, and the at least one structural element optionally includes at least one seismic element, a second electrically insulating layer, a second device layer including at least one seismic element moveably suspended above the first device layer, wherein the second device layer is formed by patterning a layer of single-crystal silicon (mono-Si), and a cap layer, wherein the handle layer, the first device layer, the second device layer and the cap layer, the first electrically insulating layer bonding the handle layer and the first device layer and the second electrically insulating layer bonding the first device layer and the second device layer are configured to form walls of an enclosure including i) the at least one seismic element in the second device layer, and ii) at least one static electrode and at least one moveable electrode for detecting and/or causing motion of the at least one seismic element, wherein the at least one static electrode is in the first device layer, the method including: forming the handle layer out of a mono-Si handle wafer, the forming of the handle layer including forming at least one cavity and simultaneously forming the at least one suspension structure on a first face of the handle layer, and covering the first face of the handle layer with a first electrically insulating layer; forming a second electrically insulating layer on a mono-Si wafer; patterning the second electrically insulating layer; depositing a poly-Si layer on top of the patterned second electrically insulating layer; forming the first device layer out of the first poly-Si layer, the forming the first device layer including thinning the first poly-Si layer into a first thickness and forming a plurality of first trenches extending through the first device layer by means of dry etching; fusion bonding the first device layer on the first electrically insulating layer on the first face of the handle layer; forming the second device layer out of the mono-Si wafer, the forming the second layer including thinning the mono-Si wafer into a second thickness, optionally forming at least one recessed area in the second mono-Si wafer, and dry etching a plurality of second trenches extending through the second mono-Si wafer; releasing structural elements of the first and second device layer by removing exposed portions of the first and second electrically insulating layers over thickness of the first and second electrically insulating layers by hydrofluoric acid (HF) etching; and enclosing structural elements within the enclosure by bonding the cap layer on top of the second device layer.

In some aspects, the techniques described herein relate to a method, wherein: patterning the second electrically insulating layer includes removing one or more portions of the second electrically insulating layer over an entire thickness of the second electrically insulating layer, and depositing a poly-Si layer causes, by filling said removed portions of the second electrically insulating layer with deposited poly-Si, generation of one or more poly-Si feedthroughs extending from the first device layer through the second electrically insulating layer to the second device layer for electrically coupling one or more structural elements of the first device layer and the second device layer.

In some aspects, the techniques described herein relate to a method, wherein: patterning the second electrically insulating layer includes recessing one or more portions of the second electrically insulating layer over a part of thickness of the second electrically insulating layer, and depositing a poly-Si layer further causes, by filling said recessed one or more portions of the second electrically insulating layer, generating one or more poly-Si stopper structures extending towards the second device layer.

In some aspects, the techniques described herein relate to a method, wherein: patterning the second electrically insulating layer includes recessing one or more portions of the second electrically insulating layer over a part of thickness of the second electrically insulating layer, and depositing a poly-Si layer further causes, by filling said recessed one or more portions of the second electrically insulating layer, generating one or more poly-Si stopper structures extending towards the second device layer.

In some aspects, the techniques described herein relate to a method, further including: forming at least one recessed area in the mono-Si wafer after thinning the first poly-Si layer into a first thickness and before forming a plurality of first trenches extending through the first device.

In some aspects, the techniques described herein relate to a method, further including: forming at least one recessed area in the mono-Si wafer after thinning the first poly-Si layer into a first thickness and before forming a plurality of first trenches extending through the first device.

In some aspects, the techniques described herein relate to a method, further including: forming at least one recessed area in the mono-Si wafer after thinning the first poly-Si layer into a first thickness and before forming a plurality of first trenches extending through the first device.

In some aspects, the techniques described herein relate to a method, further including: bonding the second device layer with the cap layer by a metallic bonding layer, wherein the metallic bonding layer forms a part of said walls of the enclosure.

In some aspects, the techniques described herein relate to a method, further including: bonding the second device layer with the cap layer by a metallic bonding layer, wherein the metallic bonding layer forms a part of said walls of the enclosure.

In some aspects, the techniques described herein relate to a method, further including: bonding the second device layer with the cap layer by a metallic bonding layer, wherein the metallic bonding layer forms a part of said walls of the enclosure.

BRIEF DESCRIPTION OF THE DRAWINGS

In the descriptions that follow, it is noted like parts are marked throughout the specification and drawings with the same numerals, respectively. The drawings are not necessarily drawn to scale and certain drawings may be shown in exaggerated or generalized form in the interest of clarity and conciseness. The disclosure itself, however, as well as a mode of use, further features and advances thereof, will be understood by reference to the following detailed description of illustrative implementations of the disclosure when read in conjunction with reference to the accompanying drawings, wherein.

DETAILED DESCRIPTION

Single-crystal silicon, mono-Si, known also as monocrystalline silicon is the well-known base semiconductor material for silicon-based discrete components and integrated circuits. It consists of silicon in which the crystal lattice of the entire solid is continuous. Mono-Si is the material of first choice for robust MEMS devices, because of its excellent mechanical strength and elasticity, and the large variety of available standard processes. It is well known in the art, that in MEMS devices, mono-Si layer is used as a conductor, for which purpose it is doped to make it electrically conducting. For example, Boron-doped P-type silicon wafers are common, but also Phosphorus (P) doped N-type wafers are used in some special applications.

In this context, polysilicon, poly-Si, known also as polycrystalline silicon or multicrystalline silicon refers to silicon consisting of small crystals, known as crystallites. Like mono-Si, also polysilicon is doped to make it electrically conducting. Poly-Si comprises mutually differently aligned crystals. Therefore, its elasticity constant is not dependent on geometry and/or direction as is the case with mono-Si. Poly-Si does not comprise oxygen like Czochralski process (CZ) grown mono-Si crystal. Furthermore, characteristics of poly-Si are easier to adjust. For example, it is easier to adjust conductivity thereof by doping, and especially highly doped poly-Si is easier to achieve than mono-Si.

In this context, silicon dioxide, known also as silica, is an oxide of silicon with chemical formula $SiO_2$. Silicon dioxide is an electrical insulator.

In the following description, direction up refers to the direction of the positive z-axis and direction down is direction of negative z-axis for convenience. It is to be understood, that these directions are not to be understood as limiting the position of use of the MEMS device. The simplified MEMS device has only a limited number of structural elements, such as anchors, beams, electrical contacts, masses and/or limiters, often just one of each. It is understood by a skilled person that an actual MEMS device may comprise more than one of any of such structural elements in any combination.

Figure 1:
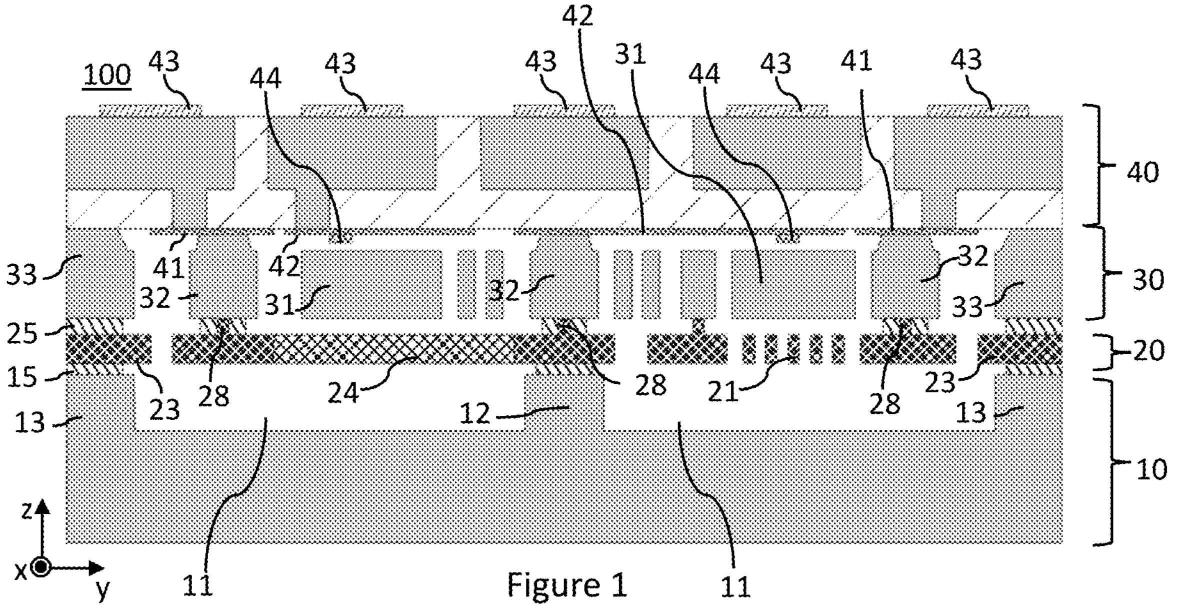
FIG. 1 illustrates a cross-section of a MEMS device in accordance with an exemplary aspect of the present disclosure.

FIG. 1 illustrates a cross-section of a MEMS device according to an aspect of the disclosure. Drawing is not in scale.

Starting from the bottom of the MEMS device 100, first layer is a handle layer 10 made of mono-Si. The handle layer 10 comprises at least one cavity 11. In the cavity 11, there is at least one suspension structure 12 also known as anchor. The at least one cavity 11 is preferably formed as a basin such that it does not reach lateral sides of the handle layer 10, so that walls 13 are provided in the handle layer 10 at least on the outer circumference thereof. The at least one cavity 11 increases distance from the bottom of the cavity 11 towards a first device layer 20 above the handle layer 10. This increased distance reduces risk of mechanical contact of a seismic element in the first device layer 20 with the handle layer 10 and decreases unwanted parasitic capacitance between the handle layer 10 and structural elements in the superimposed first device layer 20.

Between the handle layer 10 and the first device layer 20, there is an electrically insulating layer 15. The majority of the sacrificial electrically insulating layer 15 is removed during the manufacturing process, but as can be seen in the FIG. 1, portions of the electrically insulating layer 15 remain between the handle layer 10 and the first device layer 20. The electrically insulating layer is preferably made of silicon dioxide. The electrically insulating layer 15 facilitates bonding between the handle layer 10 and the first device layer 20, forms a part of walls of an enclosure in which all structural elements of the MEMS device are enclosed and is also used as sacrificial layer during manufacture, while supporting and protecting structures during the manufacturing process before removed.

The first device layer 20 made of poly-Si comprises structural elements that are mechanically suspended on the suspension structures 12 provided in the handle layer 10 and/or by suspension structures 32 provided in a second device layer 30 conveying suspension on the cap layer 40. Structural elements on the first device layer 20 may be fixed or seismic. Seismic structural elements refer to elements which are configured to move in response to a physical phenomenon, such as pressure, acceleration or angular velocity. Thickness of the poly-Si layer can be designed on basis of requirements set by types of structural elements in it. Structural elements on the first device layer 10 are advantageously used for example as fixed or seismic elements 21, such as electrodes in capacitive electrode pairs that may be used either for sensing or for driving purposes. Another possible use of structural elements on the first device layer 10 is for signal routing. This is illustrated by signal bearing beam 24 that may travel between a seismic element 31 on the second device layer 30 and the cavity 11. For reducing unwanted capacitance between the seismic element 31 and the signal bearing beam 24, the signal bearing beam 24 is preferably made narrow in lateral (x-axis) dimension so that overlapping area between the two is small.

The first device layer 20 preferably comprises a frame portion 23 that encircles structural elements of the first device layer 20 and forms part of outer walls of the enclosure that comprises structural elements of the MEMS device.

Because structural elements on the first device layer 20 are only supported to the handle layer 10 and/or via the second device layer 30 to the cap layer 40 by distinct suspension structures 12, 32, structural elements on the first device layer 20 are less sensitive to stress affecting the MEMS device 100: deformation of the cap layer 40 or the handle layer 10 due to stress causes less deformation or displacement of structural elements on the first device layer 20 and thus less change in distance occurs between structural elements of the first device layer to structural elements of the second device layer 30 due to mechanical stress affecting the MEMS device 100.

Above the first device layer 20, there is a second device layer 30 that comprises seismic elements 31 of the MEMS device 100. For facilitating seismic movement, mass of seismic elements 31 can be increased by making the second device layer 30 thicker than the first device layer 20.

Between the first device layer 20 and the second device layer 30, there is an electrically insulating layer 25. Majority of the electrically insulating layer 25 is removed in the manufacturing process, but as can be seen in the FIG. 1, portions of the electrically insulating layer 25 remain between the first device layer 20 and the second device layer 30. The electrically insulating layer is preferably made of silicon dioxide. The electrically insulating layer 25 facilitates bonding between the first device layer 20 and the second device layer 30, forms a part of walls of an enclosure in which all structural elements of the MEMS device are enclosed and is also used as sacrificial layer during manufacture, while supporting and protecting structures during the manufacturing process before removed.

Poly-Si feedthroughs 28 extending from the first device layer 20 provide electrical connections over the electrically insulating layer 25 between the first device layer 20 and the second device layer 30, enabling carrying electrical signals to and from the first device layer 20.

The second device layer 30 is made of mono-Si and comprises seismic elements that are indirectly, via the first device layer 20, suspended on the suspension structures 12 provided in the handle layer 10 and/or by rigid suspension structures 32 within the second device layer 30 that are suspended on the cap layer 40. As known in the art, for enabling movement of the seismic elements 31, suspension thereof is implemented with springs and/or flexible beams (not shown).

The second device layer 30 preferably comprises a frame portion 33 that encircles structural elements of the second device layer 30 and forms part of outer walls of the enclosure that comprises structural elements of the MEMS device 100.

Structural parts of the first and second device layers 20, 30 are enclosed in an enclosure between the handle wafer 10 and a cap layer 40 that is bonded on top of the second device layer 30. Walls 13 of the handle wafer 10, frame portions 23, 33 of the first and second device layers 20, 30 together with insulator layers 15, 25 form walls of the enclosure.

In the shown example, the cap layer 40 comprises metallized contacts 41 on the bottom face of the cap layer 40 that both mechanically and electrically couple the support structures 32. Optionally, metallized patterns may also be provided on the bottom face of the cap layer 40 to operate as static electrodes 42. Metallized contacts 41 and static electrodes 42 are electrically coupled through the cap layer 40 to metallized contact pads 43 on the top side of the cap layer 40. When no electrical contact is required between a support structure 32 and the cap layer 40, support structures 32 may be mechanically bonded to the cap layer 40 by anodic bonding. For maximum stress robustness, only the first device layer 10 should be used for static electrodes 21, but not the cap layer 40. Implementing further static electrodes 42 on the cap layer 40 makes the MEMS device more susceptible to the stress.

Optionally, the cap layer 40 may be provided with one or more bumps 44 that prevent the one or more seismic masses 31 from becoming into direct contact with the static electrodes 42 or other metallized patterns on the bottom face of the cap layer 40. Bumps 44 are preferably made of electrically insulating material such as $SiO_2$ or $Si_4N_4$.

Figure 2:
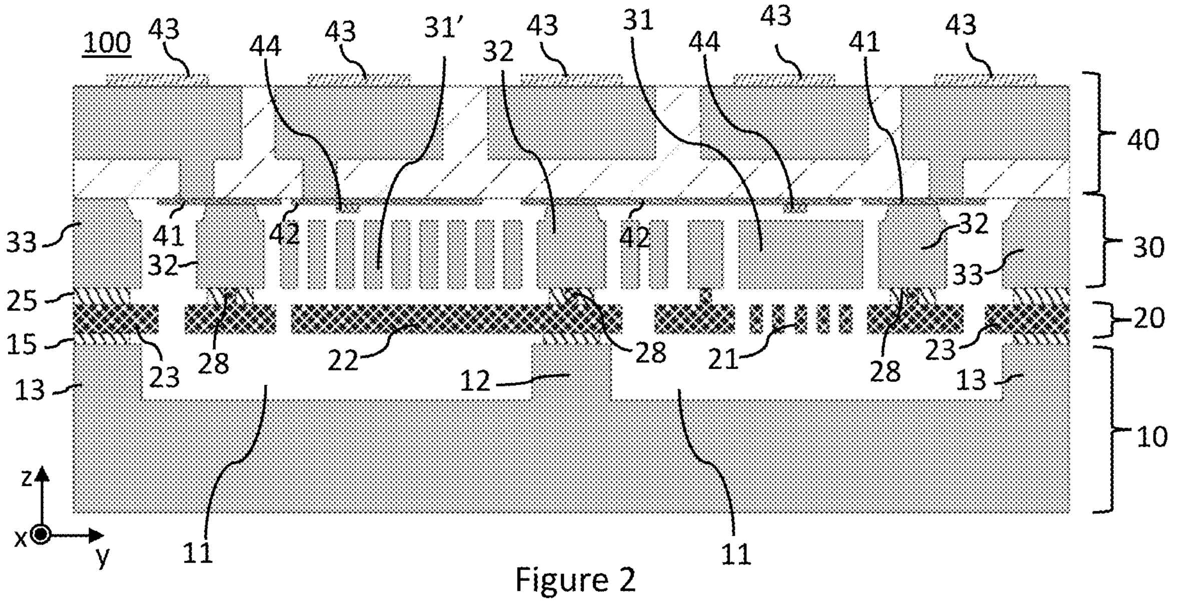
FIG. 2 illustrates a cross-section of a MEMS device in accordance with an exemplary aspect of the present disclosure.

FIG. 2 illustrates a cross-section of a MEMS device according to an aspect of the disclosure. Drawing is not in scale.

Device layers in described below correspond to the aspects described above. The main difference is that a structural element 22 such as an electrode or another seismic mass is provided in the first device layer 20 below the seismic mass 31' for capacitive detection of movement of the seismic mass 31'. In this case, lateral area of the structural element 22 may need to be so big, that a manufacturing method step for removing sacrificial silicon oxide by etching would not fully remove the sacrificial insulator layer 15 between the seismic mass 31' and the structural element 22. By perforating the seismic mass 31', efficient removal of the sacrificial layer is facilitated with the cost of reduced mass of the seismic mass 31'. However, this may be acceptable, depending on the MEMS device design.

Figure 3:
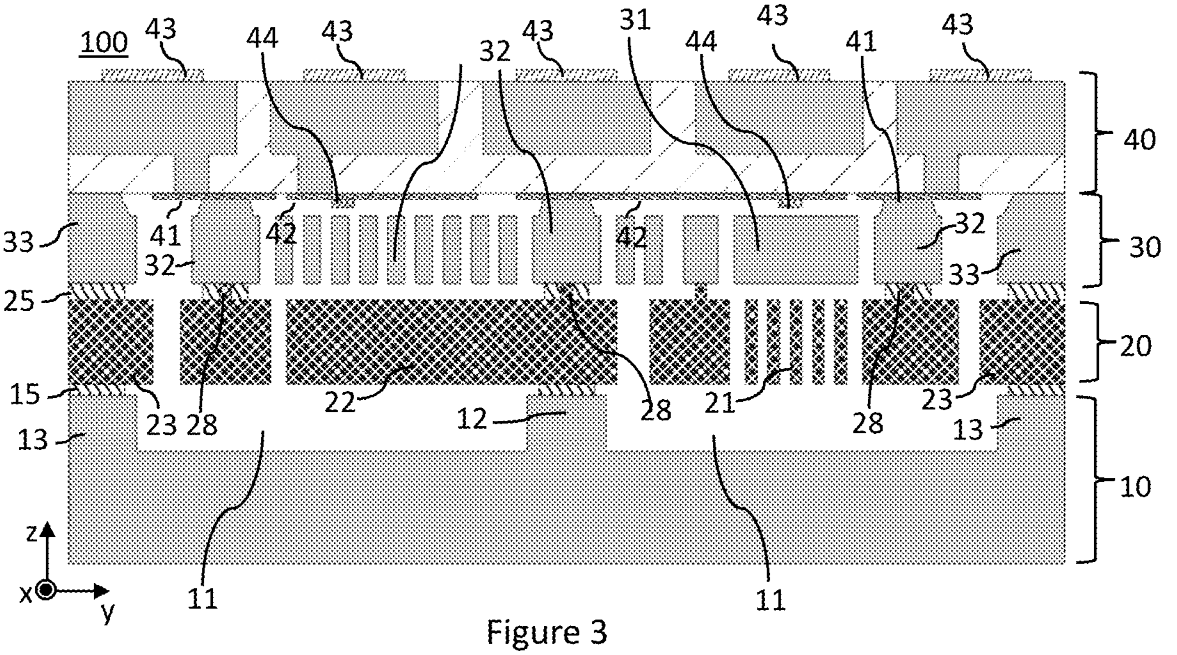
FIG. 3 illustrates a cross-section of a MEMS device in accordance with an exemplary aspect of the present disclosure.

FIG. 3 illustrates a cross-section of a MEMS device according to an aspect of the disclosure. Drawing is not in scale.

The bottom layer 10, and the second device layer 30 are similar to the aspects described above. Both layout and thickness of the second layer may be designed to achieve desired mass of structural elements 21, 22 in the first device layer 20. Increased mass is particularly beneficial with seismic elements. As understood by a skilled person, any one of the designs described herein, including the aspects described above, may have structural elements, in particular seismic elements in the first device layer 20 that benefit from having more mass by increasing thickness of the first device layer 20.

Figure 4:
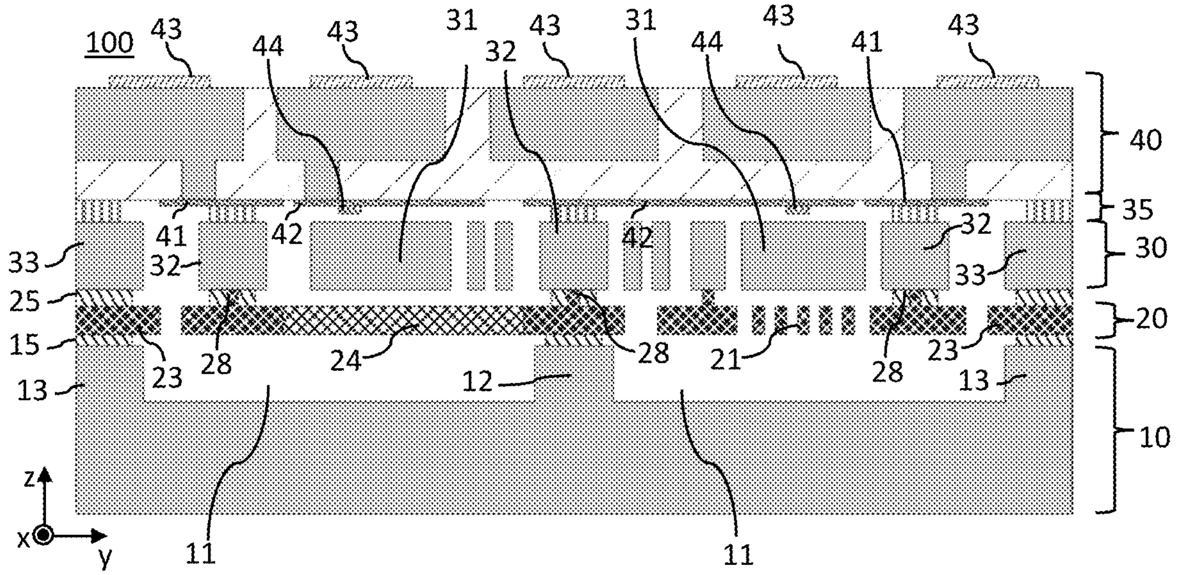
FIG. 4 illustrates a cross-section of a MEMS device in accordance with an exemplary aspect of the present disclosure.

FIG. 4 illustrates a cross-section of a MEMS device according to an aspect of the disclosure. Drawing is not in scale.

In the FIG. 4, the bottom layer 10, the first device layer 20 and the second device layer 30 are according to the aspects described above but this aspect is equally applicable with the other aspects described above. Main difference from any of the above-described aspects is that there is an additional metal bonding layer 35 between the second device layer 30 and the cap layer 40. Consequently, the second device layer does not require recessing on the side of the cap layer 40 during the manufacturing process, since the metal bonding layer 35 introduces additional distance between the second device layer 30, in particular, seismic masses 31 therein, and the cap layer 40. The concept of recessing is further explained below in connection with the exemplary manufacturing method.

FIGS. 5*a* to 5*j* illustrate an exemplary manufacturing method of a MEMS device according to aspects described above. Although this process is illustrated in connection with the aspects described above, it can be easily adjusted, if needed, to enable manufacturing of devices according to the other aspects.

Figure 5A:
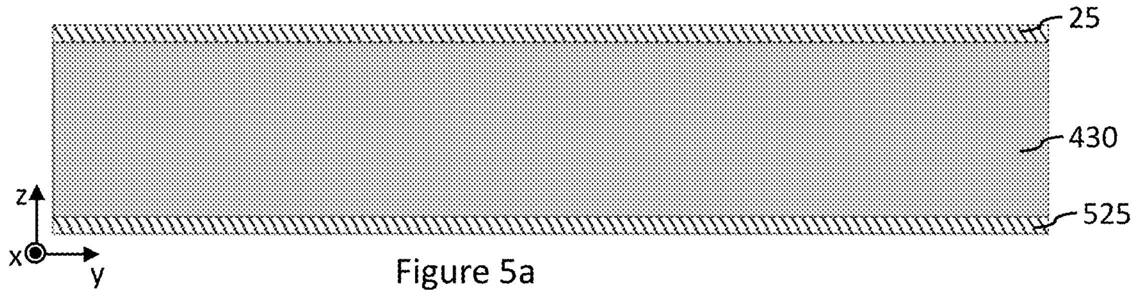
FIGS. 5*a* to 5*j* illustrate a manufacturing method of a MEMS device in accordance with an exemplary aspect of the present disclosure.

FIG. 5*a* shows a device wafer 430, which will be eventually become the second device layer. The device wafer 430 is a mono-Si wafer. An electrically insulating layer 25, preferably silicon dioxide, is built on one face of the device wafer 430. Optionally, the other face of the device wafer 430 is also protected initially with an electrically insulating layer 525. Electrically insulating layers 25, 525 are typically generated on surfaces of a wafer using thermal oxidation, which typically generates an oxide layer (a silicon dioxide layer) on all faces of the device wafer 430.

Figure 5B:
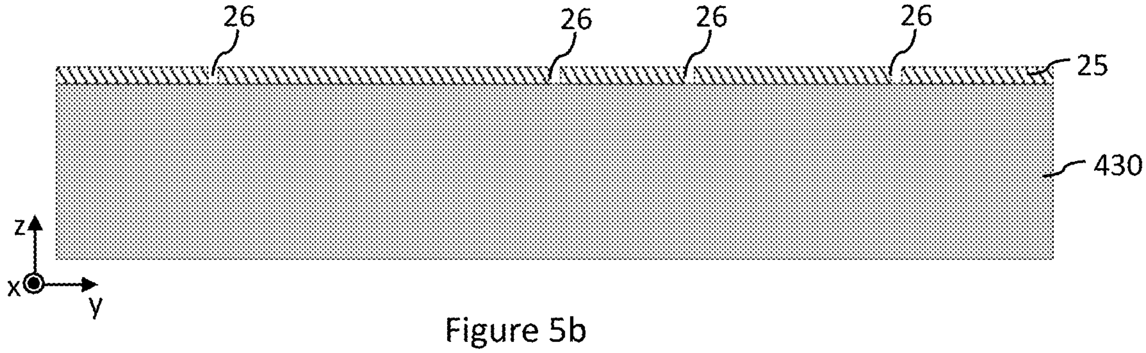

FIG. 5*b* shows patterning of the electrically insulating layer 25. The electrically insulating layer 25 is patterned by etching. Examples of applicable etching methods are wet etching by buffered hydrofluoric acid (BHF) and reactive ion plasma etching. In this example, etching is used for removing portions 26 of the electrically insulating layer 25 for the purpose of generating poly-Si feedthroughs further in the process, for electrically connecting the second device layer and the first device layer.

When using wet etching, the electrically insulating layer 525 is preferably removed from the backside of the first device wafer 430, because remaining the electrically insulating layer 525 would require additional back side protection with photoresist. Net stress of the poly-Si layer needs to be small and, in some cases, preferentially tensile. As thermally grown silicon dioxide has compressive stress, removal of electrically insulating layer 525 results in such cases smaller net stress on the wafer's top side, which helps to minimize wafer bow to ease wafer handling during processing.

Figure 5C:
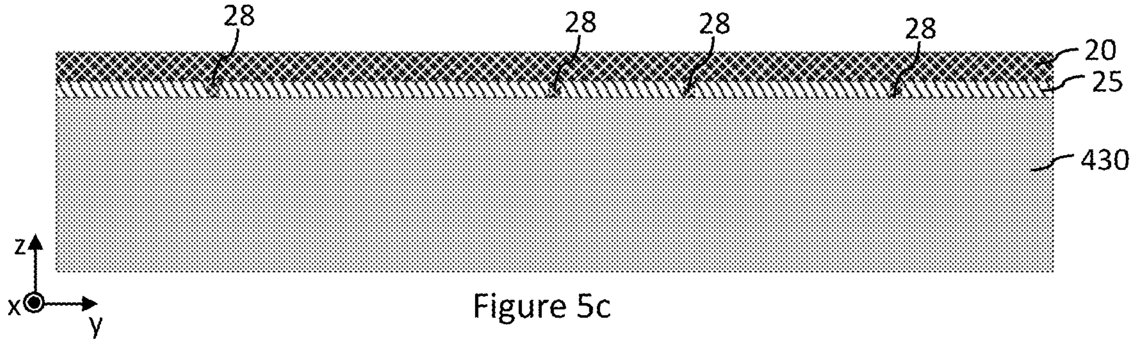

FIG. 5*c* illustrates the next step, in which a first device layer 20 is deposited on top of the patterned electrically insulating layer 25. The first device layer 20 is a poly-Si layer. Poly-Si plugs 28 for electrically connecting the first device layer and the second device layer are generated during this deposition step.

Typical steps of depositing a poly-Si layer comprises:

1) depositing a thin in-situ doped poly-Si layer. This is typically performed by a low-pressure chemical vapor deposition (LPCVD) process
2) depositing a thick in-situ doped poly-Si layer. This is typically performed by an atmospheric pressure chemical vapor deposition (APCVD) using epitaxial silicon deposition tool, nicknamed as "epi-poly"
3) polishing the poly-Si layer using chemical mechanical polishing (CMP)

In some cases, grinding of the poly-Si layer may be needed before it can be polished by CMP.

LPCVD may be used to combine steps 1 and 2, but LPCVD has 100 to 1000 times lower deposition rate than APCVD, so depositing layers with thickness required for functional MEMS device layer is not practical. For example, thickness of the poly-Si layer deposited in steps 1 and 2 may be in the order of 5 μm.

An alternative doping method is undoped deposition and doping the poly-Si layer by ion-implantation or diffusion from a solid source, such as a doped oxide, followed by annealing.

During LPCVD, deposition of poly-Si on the backside of the device wafer 430, may occur. However, this can be disregarded, since the backside of the device wafer 430 will be grinded later in the process, which removes any unwanted deposition thereon. Net stress of the poly-Si layer needs to be small.

Figure 5D:
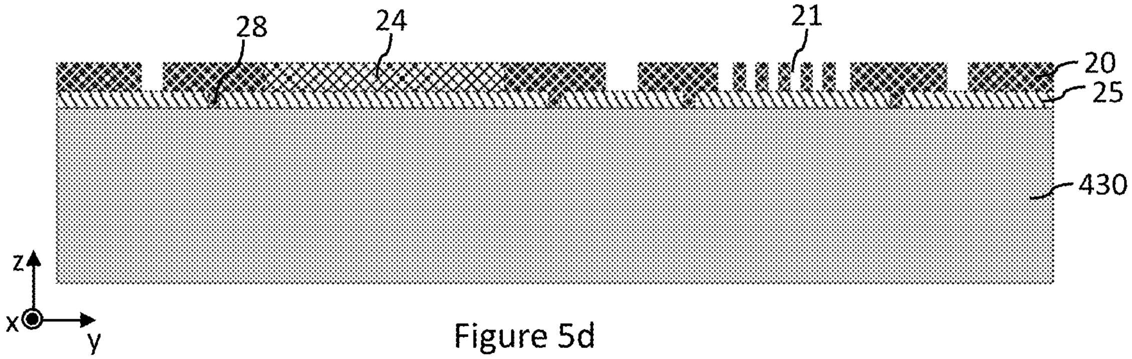

FIG. 5*d* illustrates patterning of the first device layer 20. The first device layer is preferably patterned using lithography and etching, such as DRIE etching. During patterning, structural elements 21, 24 are formed in the first device layer 20 by a plurality of trenches extending through the first device layer 20 to the second electrically insulating layer 25.

Figure 5E:
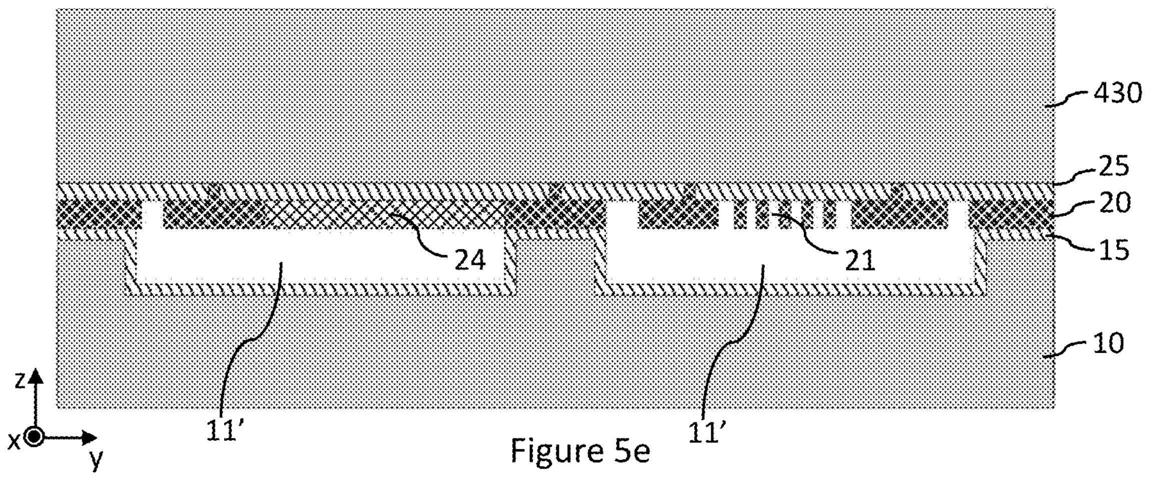

FIG. 5*e* illustrates a phase after fusion bonding the first device layer 20 with the handle layer 10 that comprises at least one oxidized cavity 11'. For this purpose, the work item has been flipped upside down so that the first device layer 20 is downwards and the second device wafer 430 is on the top.

Figure 5F:
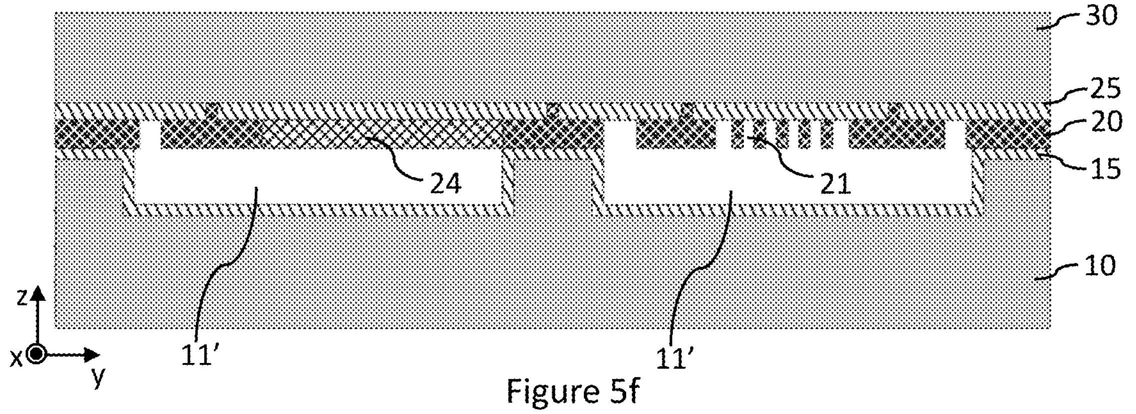

FIG. 5*f* illustrates a step after the second device wafer 430 has been thinned at least approximately into a thickness of the second device layer 30 for example by using grinding and/or etching. Chemical mechanical polishing (CMP) is used to provide smooth surface and to remove roughness after thinning and residual surface damages from grinding. A thick second device layer 30 facilitates heavier, thus more sensitive seismic masses.

Figure 5G:
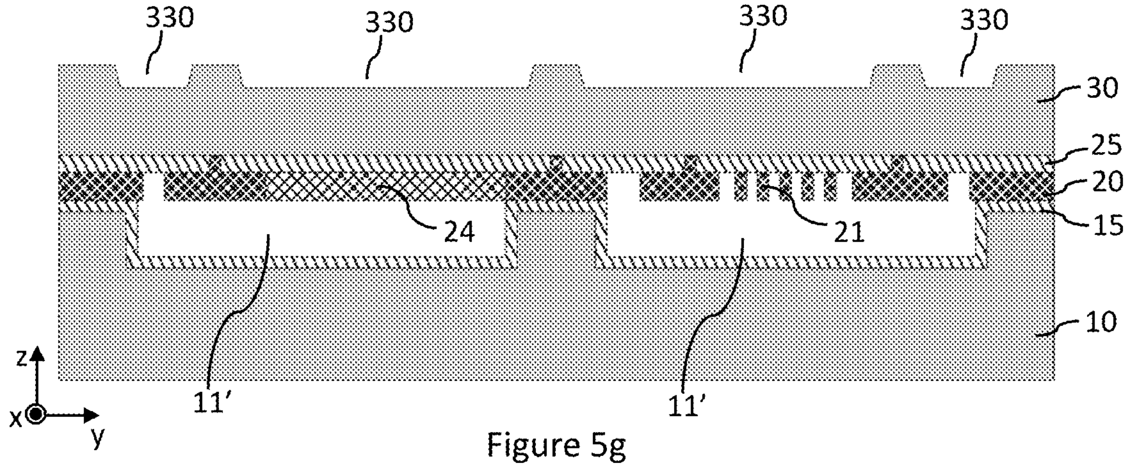

FIG. 5*g* illustrates recessed portions 330 on the upper face of the second device layer 30. Recessing of the recessed portions 330 can be performed using a Local Oxidation of Silicon (LOCOS) process, where $SiO_2$ is formed in selected areas on the upper face of the second device layer 30 and subsequently the formed $SiO_2$ is removed by etching to form the recessed portions 330 on the surface. Other alternatives exist, such as etching. One purpose of this recession is to form free space above seismic masses such that they have room for movement in z-axis direction also after a cap layer has been placed on top.

Alternative to LOCOS process, recess can be made using silicon wet etching or plasma etching. As was discussed above in reference to the aspects shown in the FIG. 4, generation of recesses portions 330 may be omitted, if metallic bonding is used for attaching a cap layer, because metallic bonding layer increases distance between seismic masses and the cap layer, which helps in avoiding mechanical contacts between these.

Figure 5H:
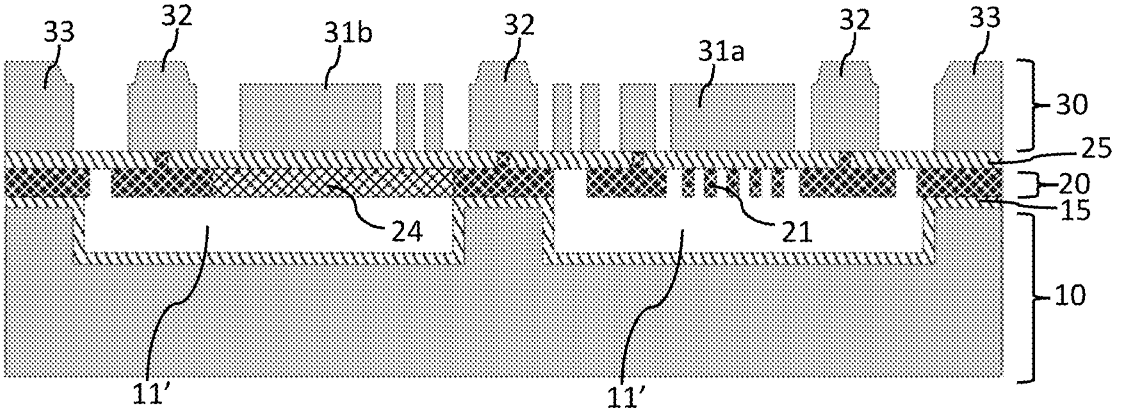

FIG. 5*h* illustrates forming of structural elements such as support structures 32 and seismic masses 31*a*, 31*b* in the second device layer 30 by patterning and etching the mono-Si layer of using dry etching such as DRIE. Structural elements of the second device layer are determined by a plurality of trenches extending through the first device layer 20 to the second electrically insulating layer 25. Although not shown, support structures in the second device layer also comprise springs and/or beams that control movement of the seismic masses. During DRIE etching, the portions of the second device layer 30 that are not to be etched are protected by a masking pattern of for example silicon dioxide (not shown).

Figure 5I:
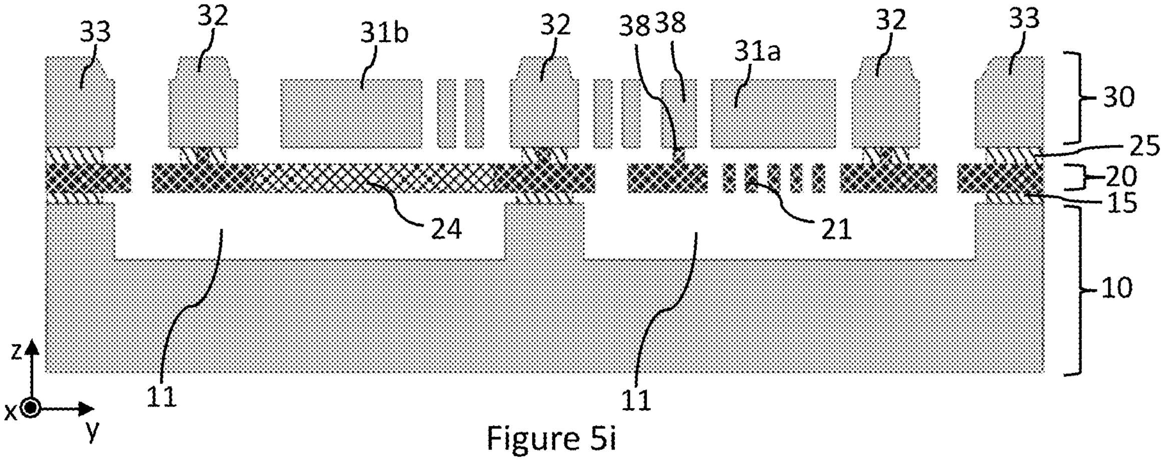

FIG. 5*i* illustrates results of releasing structural elements in the first 20 and second device layers 30 by removing buried $SiO_2$. This can be performed using hydrofluoric acid (HF) etching. In controlled HF release, a defined amount of $SiO_2$ is removed in all directions. The HF release also removes electrically insulating layer from the cavity 11 and a portion of the electrically insulating layer between the handle layer 10 and the first device layer 20 on the suspension structures 12 and on the side walls 13, between support structures 32 and structural elements on the first device layer 20 and between frame portions 23, 33 of the first device layer 20 and the second device layer 10.

A sufficient area of electrically insulating layer 15, 25 remains to maintain contact between the handle layer 10, the first device layer 20 and the second device layer 30 where needed.

According to some aspects, one or more support structures 32 may be designed to have smaller lateral dimensions such that electrically insulating layer is fully removed between the one or more support structures 32 and the first device layer 20. An example of a laterally small mechanical coupling 38 between the first device layer 20 and the second device layer 30 is shown in the FIG. 5*i*. Removal of the entire portion of electrically insulating layer 25 between a structural element of the first device layer 20 and a structural element of the second device layer 30 is enabled by designing at least one of the respective structural elements to have a small lateral area. In this non-limiting example, the structural element 37 in the second device layer 30 has small lateral dimension so that during etching of the electrically insulating layer 25, all electrically insulating material is removed at this location. This way, mechanical connections between any structural element in the second device layer 30 and structural element in the first device layer 20 may have distinctively small lateral area, which facilitates making the devices with multiple anchors smaller in size. This mechanical connection is based on poly-Si is also capable of providing an electrical connection between the two structural elements.

Figure 5J:
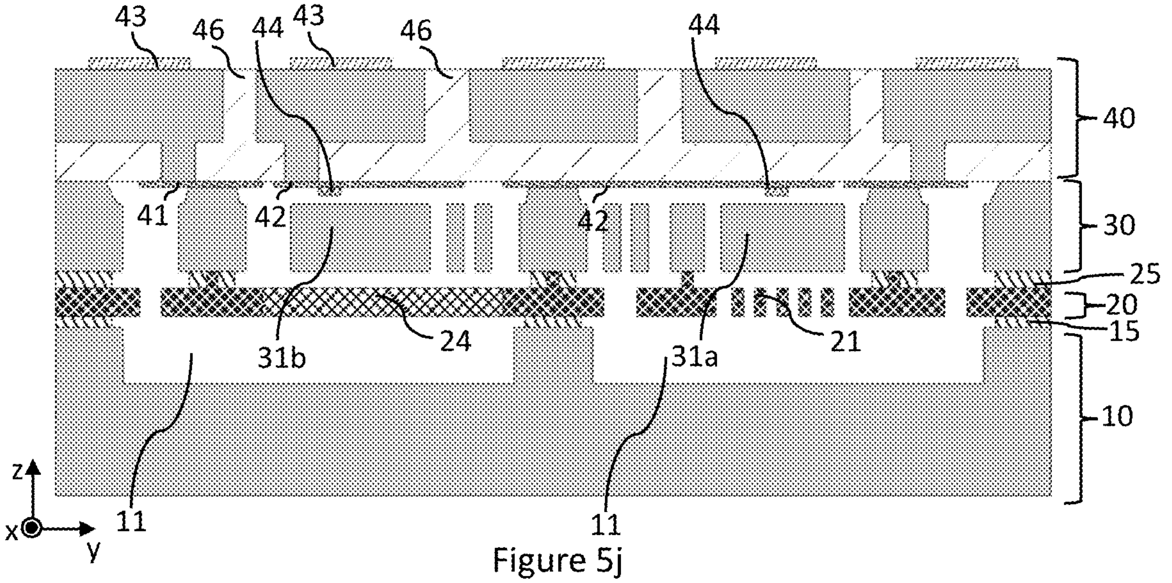

FIG. 5*j* illustrates the MEMS device 100 after structural elements have been enclosed in an enclosure by fixing a cap layer 40 on top of the second device layer 30. In this example, the cap layer 40 comprises glass 46 insulated silicon and metallized contacts 41, 43, optional static electrodes 42, and the cap layer 40 is attached using anodic bonding and using anodic bonding and subsequent back-end process. Instead of the glass insulated silicon cap layer, any other suitable type of cap layer can be used in any of the disclosed aspects. For example, the cap layer may be an Integrated Circuit (IC) wafer with electrodes.

According to some aspects, the cap layer 40 may be bonded on top of the second device layer 30 using metallic bonding as illustrated in the FIG. 4. In such case, the recessing step illustrated in the FIG. 5*g* may be omitted such that in the step 5*f*, the first device layer 30 is simply thinned to its desired thickness before forming structural elements therein by patterning and etching.

Figure 6A:
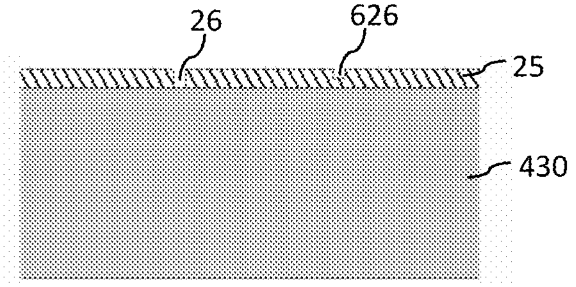
FIGS. 6*a* to 6*c* illustrate generation of a stopper structure in the manufacturing method in accordance with an exemplary aspect of the present disclosure.
Figure 6B:
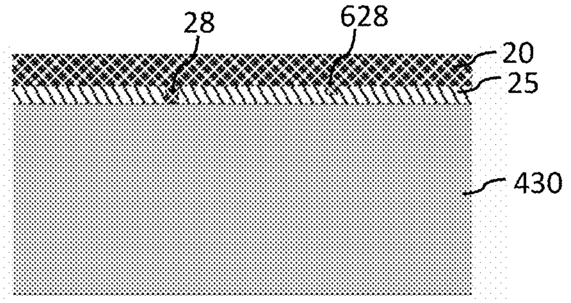
Figure 6C:
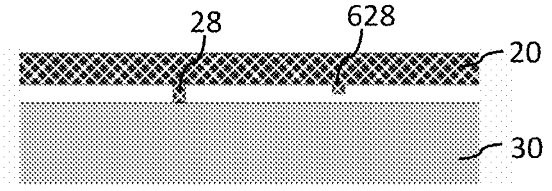

FIGS. 6*a* to 6*c* illustrate generation of a stopper structure often referred to as a "bump" extending out of the first device layer 20. Such stopper structure may be beneficial between the first device layer 20 and the second device layer 30 to avoid sticking of seismic element to a superimposed structure, such as an electrode or even another seismic element. Only a portion of different material layers and structures of the MEMS device are shown for simplicity.

FIG. 6*a* illustrates patterning of the electrically insulating layer 25 as in the FIG. 5*b*. In addition to removing portions 26 so that the device wafer 430 becomes exposed for generating the feedthrough, one or more shallow recesses 626 are generated into the electrically insulating layer 25. These recesses 626 only extend over a portion of the thickness of the electrically insulating layer 25.

FIG. 6*b* illustrates a first device layer 20 being deposited, simultaneously creating a feedthrough 28 and the stopper structure 628.

FIG. 6*c* illustrates the appearance of the exemplary feedthrough 28 and the stopper structure 628 after releasing structural elements as illustrated in the FIG. 5*i*. In this simplified illustration, neither the first device layer 20 nor the second device layer 30 are not shown as having any other structural elements, but as understood by a skilled person, this is the case as is shown in the FIG. 5*i*, and also the bottom layer 10 is already comprised in the work piece at this phase.

It is apparent to a person skilled in the art that as technology advanced, the basic idea of the disclosure can be implemented in various ways. The disclosure and its aspects are therefore not restricted to the above examples, but they may vary within the scope of the claims.

In general, it is noted that the description of the aspects disclosed should be considered as being illustrative in all respects and not being restrictive. While preferred aspects of the disclosure have been described above, it is to be understood that variations and modifications will be apparent to those skilled in the art without departing from the scope and spirit of the invention.

What is claimed:

1. A microelectromechanical system (MEMS) device comprising:

a handle layer comprising at least one cavity and at least one suspension structure, a first electrically insulating layer;

a first device layer that includes at least one structural element that is suspended by the at least one suspension structure;

a second electrically insulating layer, a second device layer comprising at least one seismic element moveably suspended above the first device layer; and a cap layer, wherein the handle layer, the first device layer, the second device layer and the cap layer, the first electrically insulating layer bonding the handle layer and the first device layer and the second electrically insulating layer bonding the first device layer and the second device layer are configured to form walls of an enclosure comprising the at least one seismic element in the second device layer, and wherein at least one static electrode is in the first device layer and with at least one moveable electrode is configured to detect and/or cause motion of the at least one seismic element.

2. The MEMS device according to claim 1, wherein the second electrically insulating layer comprises at least one polycrystalline silicon (poly-Si) feedthrough extending from the first device layer through the second electrically insulating layer to the second device layer for electrically coupling a structural element of the first device layer to a structural element of the second device layer and/or to an electrical connection in the cap layer.

3. The MEMS device according to claim 2, wherein electrically insulating material in the second electrically insulating layer is removed about the at least one poly-Si feedthrough such that the at least one poly-Si feedthrough is an only mechanical contact between the respective structural elements of the first device layer and the second device layer.

4. The MEMS device according to claim 1, wherein the first device layer comprises at least one stopper structure extending towards the second device layer over a distance that is less than a thickness of the second electrically insulating layer.

5. The MEMS device according to claim 2, wherein the first device layer comprises at least one stopper structure extending towards the second device layer over a distance that is less than a thickness of the second electrically insulating layer.

6. The MEMS device according to claim 3, wherein the first device layer comprises at least one stopper structure extending towards the second device layer over a distance that is less than a thickness of the second electrically insulating layer.

7. The MEMS device according to claim 1, further comprising a metallic bonding layer between the second device layer and the cap layer, the metallic bonding layer forming part of said walls of the enclosure.

8. The MEMS device according to claim 2, further comprising a metallic bonding layer between the second device layer and the cap layer, the metallic bonding layer forming part of said walls of the enclosure.

9. The MEMS device according to claim 3, further comprising a metallic bonding layer between the second device layer and the cap layer, the metallic bonding layer forming part of said walls of the enclosure.

10. The MEMS device according to claim 4, further comprising a metallic bonding layer between the second device layer and the cap layer, the metallic bonding layer forming part of said walls of the enclosure.

11. A method for manufacturing a microelectromechanical (MEMS) device that includes, in and order from bottom to top:

a handle layer comprising at least one cavity and at least one suspension structure, a first electrically insulating layer, a first device layer formed by patterning a layer of deposited polycrystalline silicon (poly-Si), wherein at least one structural element in the first device layer is suspended by the at least one suspension structure, a second electrically insulating layer, a second device layer comprising at least one seismic element moveably suspended above the first device layer, wherein the second device layer is formed by patterning a layer of single-crystal silicon (mono-Si), and a cap layer, wherein the handle layer, the first device layer, the second device layer and the cap layer, the first electrically insulating layer bonding the handle layer and the first device layer and the second electrically insulating layer bonding the first device layer and the second device layer are configured to form walls of an enclosure comprising i) the at least one seismic element in the second device layer, and ii) at least one static electrode and at least one moveable electrode for detecting and/or causing motion of the at least one seismic element, wherein the at least one static electrode is in the first device layer, wherein the method comprises:

forming the handle layer out of a mono-Si handle wafer, the forming of the handle layer comprising forming at least one cavity and simultaneously forming the at least one suspension structure on a first face of the handle layer, and covering the first face of the handle layer with a first electrically insulating layer;

forming a second electrically insulating layer on a mono-Si wafer;

patterning the second electrically insulating layer;

depositing a poly-Si layer on top of the patterned second electrically insulating layer;

forming the first device layer out of the first poly-Si layer, the forming the first device layer comprising thinning the first poly-Si layer into a first thickness and forming a plurality of first trenches extending through the first device layer by means of dry etching;

fusion bonding the first device layer on the first electrically insulating layer on the first face of the handle layer;

forming the second device layer out of the mono-Si wafer, the forming the second layer comprising thinning the mono-Si wafer into a second thickness, optionally forming at least one recessed area in the second mono-Si wafer, and dry etching a plurality of second trenches extending through the second mono-Si wafer;

releasing structural elements of the first and second device layer by removing exposed portions of the first and second electrically insulating layers over thickness of the first and second electrically insulating layers by hydrofluoric acid (HF) etching; and enclosing structural elements within the enclosure by bonding the cap layer on top of the second device layer.

12. The method according to claim 11, wherein:

patterning the second electrically insulating layer comprises removing one or more portions of the second electrically insulating layer over an entire thickness of the second electrically insulating layer, and depositing a poly-Si layer causes, by filling said removed portions of the second electrically insulating layer with deposited poly-Si, generation of one or more poly-Si feedthroughs extending from the first device layer through the second electrically insulating layer to the second device layer for electrically coupling one or more structural elements of the first device layer and the second device layer.

13. The method according to claim 11, wherein:

patterning the second electrically insulating layer comprises recessing one or more portions of the second electrically insulating layer over a part of thickness of the second electrically insulating layer, and depositing a poly-Si layer further causes, by filling said recessed one or more portions of the second electrically insulating layer, generating one or more poly-Si stopper structures extending towards the second device layer.

14. The method according to claim 12, wherein:

patterning the second electrically insulating layer comprises recessing one or more portions of the second electrically insulating layer over a part of thickness of the second electrically insulating layer, and depositing a poly-Si layer further causes, by filling said recessed one or more portions of the second electrically insulating layer, generating one or more poly-Si stopper structures extending towards the second device layer.

15. The method according to claim 11, further comprising forming at least one recessed area in the mono-Si wafer after thinning the first poly-Si layer into a first thickness and before forming a plurality of first trenches extending through the first device.

16. The method according to claim 12, further comprising forming at least one recessed area in the mono-Si wafer after thinning the first poly-Si layer into a first thickness and before forming a plurality of first trenches extending through the first device.

17. The method according to claim 13, further comprising forming at least one recessed area in the mono-Si wafer after thinning the first poly-Si layer into a first thickness and before forming a plurality of first trenches extending through the first device.

18. The method according to claim 11, further comprising bonding the second device layer with the cap layer by a metallic bonding layer that forms a part of said walls of the enclosure.

19. The method according to claim 12, further comprising bonding the second device layer with the cap layer by a metallic bonding layer that forms a part of said walls of the enclosure.

20. The method according to claim 13, further comprising bonding the second device layer with the cap layer by a metallic bonding layer that forms a part of said walls of the enclosure.

* * * * *